United States Patent [19]

Thornley et al.

[11] Patent Number: 4,982,053
[45] Date of Patent: Jan. 1, 1991

[54] CLOSURE ARRANGEMENT INCLUDING A RADIO FREQUENCY SEAL

[75] Inventors: David J. Thornley, Ryton; Moira A. Smith, Wickam; Philip Dale, Hexham; Samuel H. Leask, Narsden Estate; Ian M. Coutts, Preston Grange, all of United Kingdom

[73] Assignee: The Marconi Company Limited, Stanmore, United Kingdom

[21] Appl. No.: 295,693

[22] Filed: Jan. 10, 1989

[30] Foreign Application Priority Data

Jan. 13, 1988 [GB] United Kingdom ................. 8800724

[51] Int. Cl.⁵ .............................................. H05K 9/00
[52] U.S. Cl. ........................... 174/35 GC; 174/35 MS
[58] Field of Search ...................... 174/35 GC, 35 MS; 219/10.55 D; 361/424

[56] References Cited

U.S. PATENT DOCUMENTS

| | | | |
|---|---|---|---|
| 3,296,356 | 1/1967 | McAdams | 174/35 GC |
| 3,436,508 | 4/1969 | Fritz | 219/10.55 D |
| 4,291,817 | 9/1981 | Spitzer et al. | 174/35 GC X |
| 4,403,451 | 9/1983 | Douillard | 49/475 |
| 4,571,449 | 2/1986 | Lindenberger et al. | 174/35 MS |
| 4,652,695 | 3/1987 | Busby | 174/35 GC |

FOREIGN PATENT DOCUMENTS 1571579 7/1980 United Kingdom .
2183920 6/1987 United Kingdom .

Primary Examiner—Benjamin R. Fuller
Assistant Examiner—David A. Tone
Attorney, Agent, or Firm—Spencer & Frank

[57] ABSTRACT

A closure arrangement comprises an aperture-defining frame, a closure panel member which fits removeably into the frame, and a radio-frequency seal between the frame and an edge of the panel member. The seal is divided into two complementary parts attached respectively to the panel member and to the frame, the parts extending over different sections of the periphery of the aperture and cooperating to cover the entire periphery only when the panel member is closed. To improve the seal, a sharp ridge is formed in the edge of the panel member to enhance the contact pressure exerted on the seal locally on a line extending along the seal.

15 Claims, 2 Drawing Sheets 4,982,053

CLOSURE ARRANGEMENT INCLUDING A RADIO FREQUENCY SEAL

BACKGROUND OF THE INVENTION

1. Field of the Invention

This invention relates to a closure arrangement incorporating an RF seal, i.e. a seal which prevents the transmission of radio-frequency radiation. Such a closure arrangement is particularly useful in a transportable shelter for electrical equipment which is vulnerable to RF radiation.

2. Description of the Prior Art

It has been proposed to provide for such a transportable shelter a closure arrangement comprising a hinged door in a frame in whose rebate is fixed an RF seal. The door, the frame and the rest of the shelter are electrically conductive at least on the outer surface, and the purpose of the seal is to ensure electrical conductivity where the door meets the frame, so that all the incident RF radiation is absorbed.

One problem with such shelters is that the lower, horizontal edge of the door frame is particularly susceptible to contamination and damage in service when operators move in and out of the shelter: the RF seal may be broken or deformed, and may be contaminated with soil or grease or ice, for example. This may significantly impair the RF seal.

A further problem of the transportable shelters described above is the general deterioration of efficiency of the RF seal with use, due to contamination. Moreover, even before the RF seal becomes contaminated, the efficiency of the seal is affected by any irregularity in the surface of the seal or of the edge of the panel member which faces the seal, arising from manufacturing defects or accidental damage.

SUMMARY OF THE INVENTION

The invention, in its first aspect, provides a closure arrangement comprising an aperture-defining frame, a closure panel member which fits removably into the frame to close the aperture, and an RF seal, between the frame and an edge of the panel member, divided into two complementary parts attached respectively to the panel member and to the frame, in parallel planes, the parts extending over different sections of the periphery of the aperture and co-operating to cover the entire periphery only when the panel member is closed In the preferred embodiment, for example, the part of the RF seal which extends along the lower horizontal edge of the frame is carried by the panel member (in that case a door), the remainder of the RF seal being attached to the side edges and upper edge of the frame, so that the RF seal is less likely to be damaged.

A second aspect of the invention provides a closure arrangement comprising an aperture-defining frame with an attached, resiliently deformable, elongate, peripheral RF seal; and a closure panel member with a generally flat edge for engaging and compressing an outer face of the seal; the edge having a continuous land or ridge to enhance the contact pressure exerted on the seal locally on a line extending along the seal, upon closure of the aperture by the said closure panel member. The enhanced contact pressure improves the electrical contact and is more likely to overcome the effect of any irregularity in the surface of the seal or of the edge of the closure panel. Further, it is found that the land has the effect of eroding the surface of the seal to remove contaminants, in use. The land is preferably a sharp ridge.

In order that the invention may be understood, a preferred embodiment will now be described, by way of example only, with reference to the accompanying drawings.

DESCRIPTION OF PREFERRED EMBODIMENTS

Figure 1:
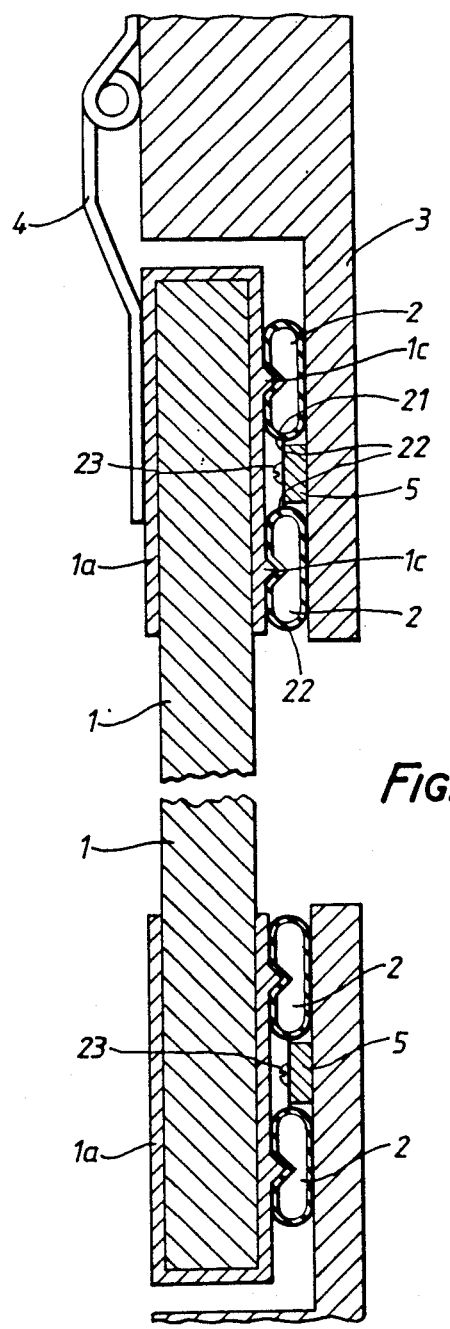
FIG. 1 is a horizontal section through a closure arrangement forming part of a transportable shelter for electronic equipment and constructed in accordance with the first aspect of the invention.

With reference first to FIG. 1, a transportable shelter for electronic equipment comprises an approximately parallelepiped enclosure (not shown) capable of being mounted on a vehicle, and having an outer surface which is electrically conductive. One face of the enclosure includes an aperture-defining frame 3 which defines a rebate for a door 1 to which it is connected by a hinge 4 along one vertical side edge. The door 1 and panels forming the enclosure, are each made from two sheets of aluminium bonded to an expanded foam core. Extruded aluminium channels 1a are fitted over the edges of the door to improve its durability.

Figure 2:
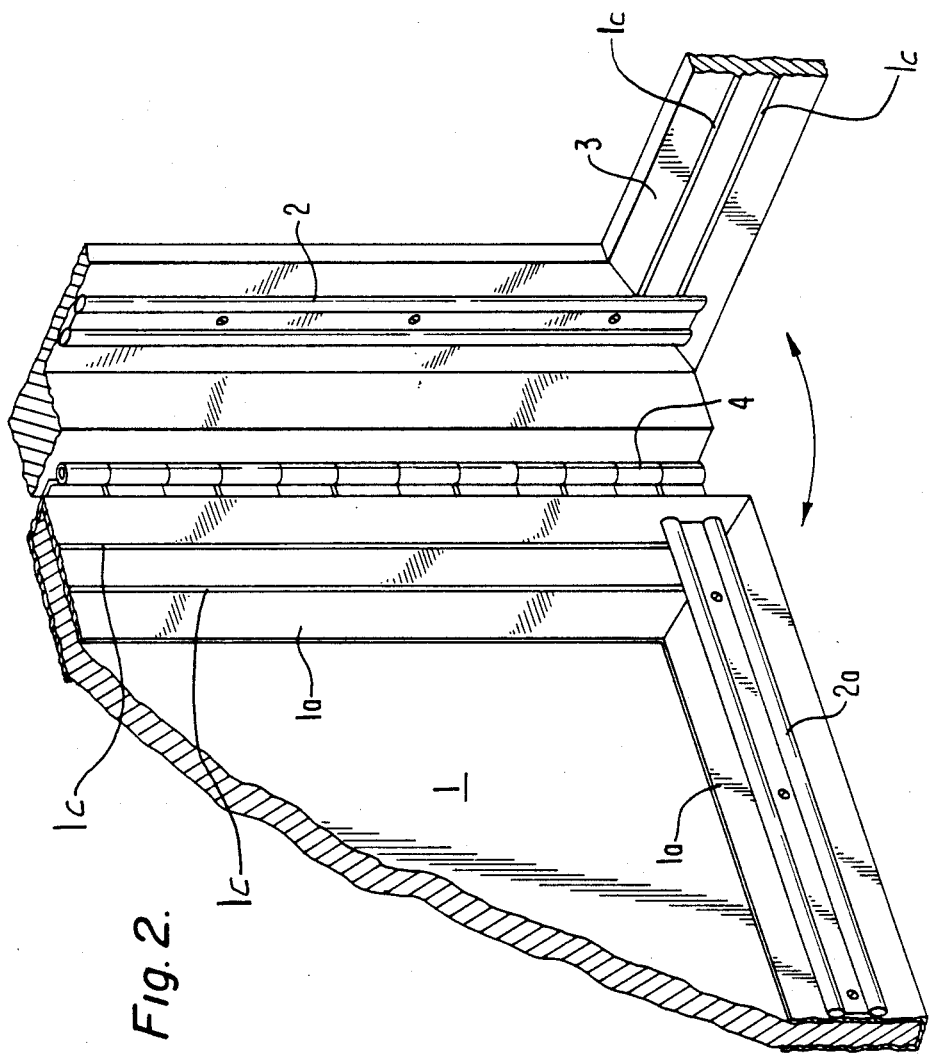
FIG. 2 is a perspective view, from the outside, of one corner of a closure arrangement of a transportable shelter of which the door is open, in accordance with the second aspect of the invention.

A peripheral RF seal 2 is provided between the frame rebate and the inner face of the edge 1a of the door 1. This seal 2 is coextensive with a first part of the periphery of the frame 3 being attached to the two vertical side edges of the frame 1, as shown in FIG. 1, and also, in a similar manner, to the upper horizontal edge of the frame 3 (not shown). However, as shown in FIG. 2, the lower horizontal portion 2a of the RF seal is coextensive with a second part of the door 1 being carried instead by the door 1 on a corresponding edge 1a. The seal 2, in its relaxed condition with the door open, has a circular cross-section.

When the door is closed, in use, the seal 2 is compressed to an oval shape in cross-section, as shown in FIG. 1, due to pressure from strips of the opposed flat inner faces of the door edge 1a and the frame 3. This elongation of the cross-sectional shape of the seal 2 causes it to exert a strong pressure against a sharp corner of a ridge 5 projecting from the frame rebate (or from the door edge 1a, as the case may be), to enhance the RF seal. In the relaxed condition, the seal 2 just contacts that sharp corner.

In accordance with the second aspect of the invention, the edges 1a of the door 1 which engage the RF seal 2 on the frame 3, and the edge of the frame 3 which engages the RF seal 2a on the door 1, are provided with a pair of sharp, parallel ridges 1c extending along the edge. In use, upon closure of the aperture by the door 1, as shown in FIG. 1, each ridge 1c enhances the contact pressure exerted on the seal 2 (or 2a) locally on a line extending along the seal at its centre. The regions of the edge 1a immediately adjacent the ridge 1c are flat and compress the whole of the outer face of the corresponding seal 2, but with less pressure. As can be clearly seen from the horizontal section of FIG. 1, the width of ridge 1c in the horizontal direction is less than the horizontal width of the seal 2 and less than the horizontal width of edge 1a. The result of this is that the electrical contact between the edge 1a and the RF seal 2 or 2a is improved in comparison to previous such arrangements without the ridges 1c, partly because of the enhanced local pressure, and partly because the ridges 1c remove contaminants from the surface of the RF seal, upon closure of the door, by abrasion and erosion The RF seal 2 or 2a comprises a pair of parallel, oval-section, resiliently deformable, silicon compound tubes 21 covered by a metal mesh or braid 22 A web of the metal braid 22 extends from one tube 21 to the other and is affixed by bolts 23 to the ridge 5 projecting from the frame rebate; or from the door edge 1a, as the case may be.

As stated above, in accordance with the first aspect of the invention, the peripheral RF seal is divided into two complementary parts 2, 2a which co-operate to cover the entire periphery only when the door 1 is closed. It will be appreciated that there is an overlap of the different sections of the RF seal at the corners, of which one corner is shown in FIG. 2. To prevent any loss of seal due to deformation adjacent the region of overlap, the end of the tube 21 of one only of the sections may be cut back so that, although the braids 22 still overlap to provide the seal, the tubes 21 do not overlap, thus avoiding any significant increase in seal thickness.

Although in the example described the portion of the RF seal carried by the door is the lower horizontal portion, the peripheral extent of the two parts of the RF seal may be divided in any desired manner between the door and its frame; indeed, the invention is applicable to any closure arrangement including those in which the closure panel member is positioned above floor level, for example.

What we claim is:

1. A closure arrangement comprising an aperture-defining frame, a closure panel member which fits removeably into the frame to close the aperture, and an RF seal, between the frame and an edge of the panel member, divided into two complementary parts attached respectively to the panel member and to the frame, in parallel planes, the parts extending over different sections of the periphery of the aperture and cooperating to cover the entire periphery only when the panel member is closed.

2. A closure arrangement as claimed in claim 1, in which the RF seal comprises a resiliently deformable inner member covered with a flexible, electrically conductive material.

3. A closure arrangement as claimed in claim 2, in which the electrically conductive material is a metal mesh.

4. A closure arrangement as claimed in claim 1, in which the RF seal comprises resiliently deformable tubing.

5. A closure arrangement as claimed in claim 4, in which the tubing is of a silicon compound.

6. A closure arrangement comprising an aperture-defining frame with an attached, resiliently deformable, elongate, peripheral RF seal; and a closure panel member with a generally flat edge of a predetermined width for engaging and compressing an outer face of the seal; the edge having a continuous outwardly extending ridge of a width less than the width of said edge and less than the width of said seal for enhancing the contact pressure exerted on the seal locally on a line extending along the seal, upon closure of the aperture by said closure panel member.

7. A closure arrangement as claimed in claim 6, in which said ridge is a sharp ridge.

8. A closure arrangement as claimed in claim 6, in which the RF seal comprises a resiliently deformable inner member covered with a flexible, electrically conductive material.

9. A closure arrangement as claimed in claim 8, in which the electrically conductive material is a metal mesh.

10. A closure arrangement as claimed in claim 6, in which the RF seal comprises resiliently deformable tubing.

11. A closure arrangement as claimed in claim 10, in which the tubing is of a silicon compound.

12. A closure arrangement, comprising:
a frame having a peripheral portion defining an aperture therethrough, the peripheral portion of said frame being divided into first and second parts each having a flat surface;
a closure member having a peripheral portion movable into a closely adjacent parallel relationship with the peripheral portion of said frame, the peripheral portion of said closure member being divided into first and second parts each having a flat surface; and
radio frequency sealing means interposed between the peripheral portions of said frame and said closure member, said radio frequency sealing means including
a first compressible radio frequency sealing member attached to and coextensive with the flat surface of the first part of the peripheral portion of said frame;
first ridge means attached to and coextensive with the flat surface of the second part of the peripheral portion of said frame;
a second compressible radio frequency sealing member attached to and coextensive with the flat surface of the second part of the peripheral portion of said closure member; and
second ridge means attached to and coextensive with the flat portion of the first part of the peripheral portion of said closure member, said first compressible sealing member being compressed between the flat surface on the first part of said frame and said second ridge means, and said second compressible sealing member being compressed between the flat surface on the second part of said closure member and said first ridge means, whereby when the peripheral portion of said closure member is moved into said closely adjacent parallel relationship with the peripheral portion of said frame and said first and second compressible sealing members are compressed the transmission of radio-frequency radiation therethrough is minimized.

13. A closure arrangement as claimed in claim 12, wherein the widths of said first and second compressible radio frequency sealing members, defined as having a direction perpendicular to the direction in which said sealing members extend and perpendicular to the flat surfaces of said frame and closure members respectively, are greater than the widths of said second and first ridge means in the same direction, whereby said ridge means contact less than the entire widths of said second and first compressible seals when the peripheral portion of said closure member is moved closely adjacent to and parallel to the peripheral portion of said frame.

14. A closure arrangement as claimed in claim 12, wherein each of said first and second radio frequency sealing members has first and second spaced parallel parts, and each of said first and second ridge means includes first and second spaced parallel ridges for compressing respective parts of said second and first sealing members.

15. A closure arrangement as claimed in claim 14, further comprising first and second electrically conductive metal meshes surrounding and extending between said first and second spaced parallel parts of said first and second radio frequency sealing members.

* * * * *